(12) United States Patent
Bahl et al.

(10) Patent No.: US 10,827,624 B2
(45) Date of Patent: Nov. 3, 2020

(54) CATALYTIC LAMINATE WITH CONDUCTIVE TRACES FORMED DURING LAMINATION

(71) Applicant: Sierra Circuits, Inc., Sunnyvale, CA (US)

(72) Inventors: Kenneth S Bahl, Saratoga, CA (US); Konstantine Karavakis, Pleasanton, CA (US)

(73) Assignee: CATLAM, LLC, Sunnyvale, CA (US)

( * ) Notice: Subject to any disclaimer, the term of this patent is extended or adjusted under 35 U.S.C. 154(b) by 44 days.

(21) Appl. No.: 15/911,515

(22) Filed: Mar. 5, 2018

(65) Prior Publication Data

US 2019/0274221 A1 Sep. 5, 2019

(51) Int. Cl.
*H05K 3/00* (2006.01)
*H05K 3/18* (2006.01)
(Continued)

(52) U.S. Cl.
CPC ......... *H05K 3/185* (2013.01); *C23C 18/1608* (2013.01); *C23C 18/204* (2013.01);
(Continued)

(58) Field of Classification Search
CPC ........ H05K 3/185; H05K 1/092; H05K 1/115; H05K 3/0017; H05K 3/107; H05K 3/4038;
(Continued)

(56) References Cited

U.S. PATENT DOCUMENTS 638,406 A 12/1899 Stone
3,014,818 A 12/1961 Wildy
(Continued)

FOREIGN PATENT DOCUMENTS

DE 3121015 C2 12/1986
EP 0472158 A3 10/1992
(Continued)

OTHER PUBLICATIONS

International Search Report and Written Opinion of the International Searching Authority for related PCT/US2015/014599 dated May 28, 2015.
(Continued)

*Primary Examiner* — Pete T Lee
(74) *Attorney, Agent, or Firm* — File-EE-Patents.com; Jay A. Chesavage

(57) ABSTRACT

A circuit board is formed from a catalytic laminate having a resin rich surface with catalytic particles dispersed below a surface exclusion depth. Trace channels and apertures are formed into the catalytic laminate, electroless plated with a metal such as copper, filled with a conductive paste containing metallic particles, which are then melted to form traces. In a variation, multiple circuit board layers have channels formed into the surface below the exclusion depth, apertures formed, are electroless plated, and the channels and apertures filled with metal particles. Several such catalytic laminate layers are placed together and pressed together under elevated temperature until the catalytic laminate layers laminate together and metal particles form into traces for a multi-layer circuit board.

24 Claims, 5 Drawing Sheets

(51) Int. Cl.
*C23C 18/16* (2006.01)
*C23C 18/20* (2006.01)
*C23C 18/38* (2006.01)
*H05K 3/40* (2006.01)
*H05K 1/09* (2006.01)
*H05K 1/11* (2006.01)
*H05K 3/46* (2006.01)
*H05K 3/10* (2006.01)

(52) U.S. Cl.
CPC .......... *C23C 18/38* (2013.01); *H05K 1/092* (2013.01); *H05K 1/115* (2013.01); *H05K 3/0017* (2013.01); *H05K 3/107* (2013.01); *H05K 3/4038* (2013.01); *H05K 3/4602* (2013.01); *H05K 2201/0236* (2013.01); *H05K 2203/0716* (2013.01); *H05K 2203/107* (2013.01)

(58) Field of Classification Search
CPC ........ H05K 3/4602; H05K 2201/0236; H05K 2203/0716; H05K 2203/107; C23C 18/1608; C23C 18/204; C23C 18/38
See application file for complete search history.

(56) References Cited

U.S. PATENT DOCUMENTS

| | | | |
|---|---|---|---|
| 3,226,256 A | 12/1965 | Schneble et al. | |
| 3,259,559 A | 7/1966 | Schneble et al. | |
| 3,269,861 A | 8/1966 | Schneble et al. | |
| 3,269,891 A | 8/1966 | Florus et al. | |
| 3,322,881 A | 5/1967 | Schneble et al. | |
| 3,370,974 A | 2/1968 | Hepfer | |
| 3,546,009 A | 12/1970 | Schneble et al. | |
| 3,701,675 A * | 10/1972 | Gottfried ............ | C23C 18/1641 427/307 |
| 3,799,802 A | 3/1974 | Schneble et al. | |
| 3,925,138 A | 12/1975 | Shaul et al. | |
| 4,001,466 A | 1/1977 | Shaul et al. | |
| 4,145,460 A | 3/1979 | Finley et al. | |
| 4,167,601 A | 9/1979 | Beckenbaugh et al. | |
| 4,188,415 A | 2/1980 | Takahashi et al. | |
| 4,248,921 A | 2/1981 | Steigerwald et al. | |
| 4,287,253 A | 9/1981 | Leech | |
| 4,354,895 A | 10/1982 | Ellis | |
| 4,457,952 A | 7/1984 | Kawamoto et al. | |
| 4,512,829 A | 4/1985 | Ohta et al. | |
| 4,581,301 A | 4/1986 | Michaelson | |
| 4,585,502 A | 4/1986 | Uozu et al. | |
| 4,770,900 A | 9/1988 | Seibel | |
| 4,859,571 A | 8/1989 | Cohen et al. | |
| 4,908,242 A | 3/1990 | Hughes et al. | |
| 4,954,185 A | 9/1990 | Kohm | |
| 5,112,726 A | 5/1992 | Cohen et al. | |
| 5,153,987 A | 10/1992 | Takahashi et al. | |
| 5,162,144 A | 11/1992 | Brown et al. | |
| 5,200,720 A | 4/1993 | Yi | |
| 5,260,170 A | 11/1993 | Brown | |
| 5,272,600 A | 12/1993 | Carey | |
| 5,309,632 A | 5/1994 | Takahashi et al. | |
| 5,340,746 A | 8/1994 | Hagen et al. | |
| 5,347,712 A | 9/1994 | Yasuda et al. | |
| 5,419,954 A | 5/1995 | Lane et al. | |
| 5,470,532 A | 11/1995 | Hagen et al. | |
| 6,452,278 B1 | 9/2002 | DiCaprio et al. | |
| 6,489,720 B1 | 12/2002 | Gofuku et al. | |
| 6,696,173 B1 | 2/2004 | Naundorf et al. | |
| 7,067,454 B2 | 6/2006 | Raybould | |
| 7,169,691 B2 | 1/2007 | Doan | |
| 7,271,099 B2 | 9/2007 | Bromley et al. | |
| 7,319,050 B2 | 1/2008 | Chang et al. | |
| 7,334,326 B1 | 2/2008 | Huemoeller et al. | |
| 7,632,753 B1 | 12/2009 | Rusli et al. | |
| 7,752,752 B1 | 7/2010 | Rusli et al. | |
| 8,059,415 B2 | 11/2011 | Nelson et al. | |
| 8,158,267 B2 | 4/2012 | Tacken et al. | |
| 8,187,478 B2 * | 5/2012 | Liu ........ | H05K 3/107 216/13 |
| 8,648,277 B2 | 2/2014 | Alpay et al. | |
| 8,779,576 B2 | 7/2014 | Park et al. | |
| 8,784,973 B2 | 7/2014 | Sugimura et al. | |
| 8,836,144 B2 | 9/2014 | Liao | |
| 8,922,014 B2 | 12/2014 | Hu et al. | |
| 8,941,222 B2 | 1/2015 | Hunt | |
| 9,000,558 B2 | 4/2015 | Sarfaraz et al. | |
| 9,000,587 B1 | 4/2015 | Kelkar et al. | |
| 9,087,732 B1 | 7/2015 | Xu et al. | |
| 9,117,714 B2 | 8/2015 | Weng et al. | |
| 9,136,196 B2 | 9/2015 | Rathburn | |
| 9,380,700 B2 | 6/2016 | Karavakis et al. | |
| 2002/0195716 A1 | 12/2002 | Magnuson et al. | |
| 2004/0134682 A1 | 7/2004 | En et al. | |
| 2004/0224252 A1 | 11/2004 | Kondo et al. | |
| 2004/0226745 A1 | 11/2004 | En | |
| 2006/0055021 A1 | 3/2006 | Yamamoto | |
| 2006/0057341 A1 | 3/2006 | Kawabata et al. | |
| 2006/0068173 A1 | 3/2006 | Kajiyama et al. | |
| 2007/0014975 A1 | 1/2007 | Ota | |
| 2008/0041615 A1 | 2/2008 | Zhong et al. | |
| 2009/0120660 A1 * | 5/2009 | Park ........ | H05K 3/045 174/110 R |
| 2010/0127271 A1 * | 5/2010 | Daniel ........ | H01L 27/283 257/72 |
| 2010/0266752 A1 | 10/2010 | Tseng et al. | |
| 2011/0048783 A1 * | 3/2011 | Yu ........ | H05K 3/465 174/261 |
| 2012/0074094 A1 * | 3/2012 | Chiang ........ | H01L 21/4846 216/18 |
| 2013/0043062 A1 | 2/2013 | Wismann | |
| 2015/0284856 A1 | 10/2015 | Liu et al. | |
| 2015/0334825 A1 | 11/2015 | Bahl et al. | |
| 2015/0334826 A1 | 11/2015 | Karavakis et al. | |
| 2015/0334854 A1 | 11/2015 | Karavakis et al. | |
| 2016/0135297 A1 | 5/2016 | Karavakis et al. | |
| 2016/0148893 A1 | 5/2016 | Bahl et al. | |
| 2018/0166354 A1 * | 6/2018 | Imayoshi ........ | H01L 23/15 |

FOREIGN PATENT DOCUMENTS

| | | |
|---|---|---|
| EP | 1367872 A3 | 12/2005 |
| EP | 2120525 A1 | 11/2009 |
| EP | 2420593 B1 | 4/2013 |
| EP | 2584064 A2 | 4/2013 |
| GB | 1208337 A | 10/1970 |
| WO | 2009006010 A3 | 2/2009 |
| WO | 2012127205 A1 | 9/2012 |
| WO | 2014041057 A1 | 3/2014 |

OTHER PUBLICATIONS

International Search Report and Written Opinion of the International Searching Authority for related PCT/US2015/014615 dated May 20, 2015.
International Search Report and Written Opinion of the International Searching Authority for related PCT/US2015/014619 dated Jun. 5, 2015.
M-CAM International, LLC., Sierra Circuits Innovation Data Analysis, Appendix C—Selected Art of Interest for U.S. Appl. No. 14/281,631 and Continuation, 2015.
M-Cam International, LLC., Sierra Circuits Innovation Data Analysis, Appendix B—Selected Art of Interest for U.S. Appl. No. 14/281,802, 2015.
PCT International Preliminary Report on Patentability for PCT Application PCT/US2015/014599, dated Nov. 22, 2016.
PCT International Preliminary Report on Patentability for PCT Application PCT/US2015/014619, dated Dec. 1, 2016.

* cited by examiner

Catalytic Particle Distribution through Prepreg

Single Layer process

Catalytic Laminate Process
Figure 6A Catalytic Laminate
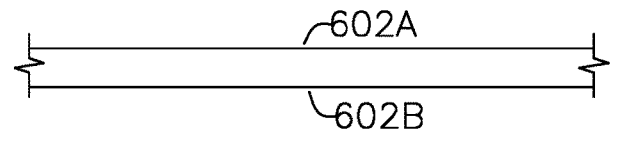
Figure 6B Laser Drilled Holes
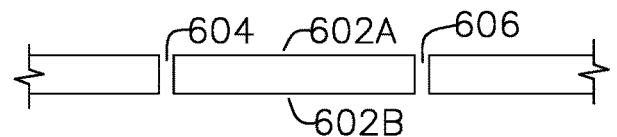
Figure 6C Form Channels
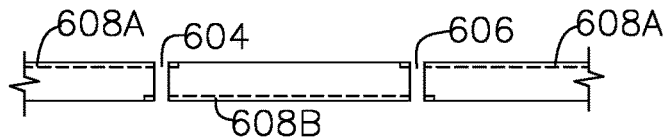
Figure 6D Electroless Cu Flash
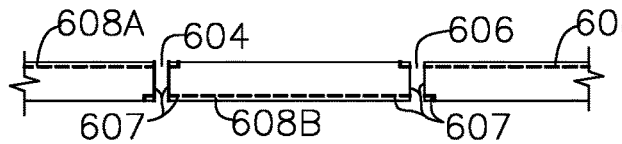
Figure 6E Paste application
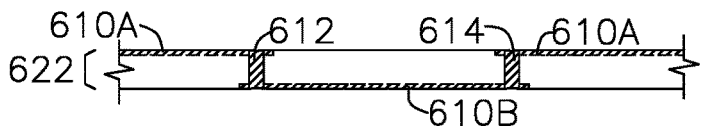
Figure 6F Sandwich w/oth layers
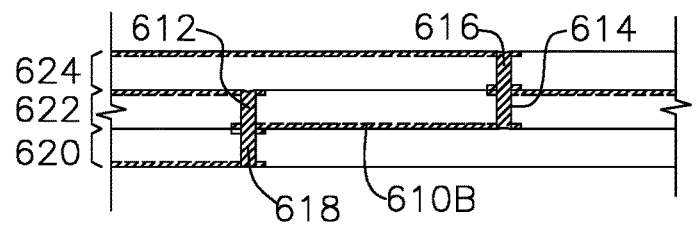
Figure 6G After Reflow
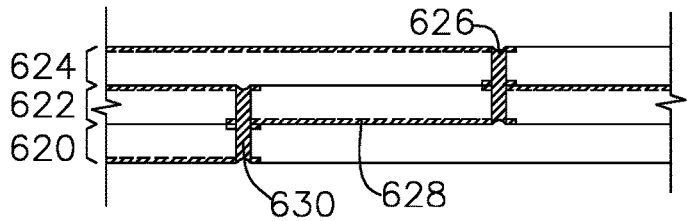

Catalytic Laminate Process
Outer Layer Processing

Catalytic Laminate

Laser Drilled Holes

Form Channels

Electroless Cu Flash

Solder Dip

Hot Air Knife

Top View A-A

CATALYTIC LAMINATE WITH CONDUCTIVE TRACES FORMED DURING LAMINATION

FIELD OF THE INVENTION

The present invention relates to a catalytic laminate and its uses for forming traces. In particular, the laminate has properties which provide for fine pitch circuit interconnects which can be formed in channels with copper flash and solder paste to form circuit board layers having planar surfaces with embedded or surface conductors.

BACKGROUND OF THE INVENTION

Prior art printed circuit boards (PCB) are formed using conductive metal interconnects (known as "traces") formed on a dielectric substrate, where each surface carrying conductors is known as a "layer". Each dielectric core has traces formed on one surface or on both surfaces, and by stacking several such dielectric cores having traces formed in them interspersed with bare dielectric layers, and laminating them together under temperature and pressure, a multi-layer printed circuit may be formed. The dielectric substrate comprises an epoxy resin embedded in a fiber matrix such as glass fiber woven into a cloth. In one prior art fabrication method, copper is laminated onto the outer surfaces of a dielectric layer, the copper surfaces are patterned such as with a photoresist or photo sensitive film to create masked and unmasked regions, and then etched to form a conductive trace layer on one or both sides of the core dielectric. A stack of dielectric cores with conductive traces may then be laminated together to form multi-layer boards, and any layer interconnects made with vias, which are drilled holes plated with copper to form annular rings which provide connectivity from one layer to another.

Printed circuit boards (PCB) are typically used to provide conductive traces between various electronic components mounted on the PCB. One type of electronic component is a through-hole device which is mounted on the PCB by having leads positioned through one or more holes in the PCB, where the PCB hole includes a conductive annular ring pad on each trace connect layer, and the component lead is soldered to the annular ring pad of the PCB hole. Through hole components have leads which tend to be difficult to align with the associated PCB mounting hole, but surface mount technology (SMT) provides a preferable mounting system, where component leads are simply placed on the surface of a PCB pad and soldered, which is preferred for PCB assembly because of the higher density and ease of mechanized assembly. Surface mount components require only surface mount pads on an outside finished PCB layer. Within a two layer or multi-layer PCB, interconnections of conductive traces from one layer to another are accomplished using through-hole vias, where a conductive trace on one trace layer leads to a through hole which is typically drilled through one or more dielectric layers of the PCB and plated with copper or other conductive metal to complete the trace layer connection. A hole drilled through all dielectric layers is known as a thru-via, a hole drilled through an outer layer only (typically as part of the fabrication of the individual layer) is known as a micro-via, and a hole drilled through one or more inner layers is known as a blind via. For any of these via types, the via is patterned to include an annular ring conductor region on opposite trace layers of the PCB, with the drilled hole lined with conductive material which connects the annular ring conductors on either side of the laminate or PCB.

The thickness of pre-patterned or post-patterned copper on a printed circuit board laminate may be increased using electroplating, where the PCB or dielectric layer with traces is placed in an electrolytic bath, and a DC voltage source is connected between a sacrificial anodic conductor (such as a copper rod) to an existing conductive layer of a PCB. Where a pre-existing conductive copper layer is not present on a PCB to facilitate electroplating, such as the case of bare dielectric material or drilled via holes, a seed layer of copper must first be deposited. This is done using an electroless process with the assistance of a "seed" catalytic material (which enhances the deposition of a particular conductive material) which is deposited on the surface of the dielectric, and the circuit board layer is then placed in an electroless bath. For a catalyst such as palladium and an electroless bath of copper, the copper ions in solution deposit over the palladium until the surface is covered sufficiently to provide uniform electrical conductivity, after which the copper deposited using the electroless process provides a conductive scaffold for the subsequent addition of material using the electroplating process. Electroplating is preferred for finishing the plating operation, as it has a faster deposition rate than the electroless plating process.

As electronic assemblies increase in complexity, it is desired to increase component densities on PCB assemblies, such as by using smaller trace widths (known as fine pitch traces) in conjunction with increasingly dense integrated circuit (IC) lead patterns. One problem of prior art surface mount PCB fabrication and assembly methods is that because the traces are formed on the surface of the dielectric, the adhesion between copper trace and underlying laminate for narrower conductor line widths (known as fine pitch traces) is reduced, causing the fine pitch traces and component pads to separate (lift) during a component replacement operation, ruining the entire circuit board assembly and expensive components on it. Another problem of fine pitch surface traces is that when fabricating a multi-layer circuit board, the individual trace layers are laminated together under pressure in an elevated temperature environment. During lamination, fine pitch traces tend to migrate laterally across the surface of the dielectric during the high temperature lamination, when the resin is in a semi-liquid state. In high speed circuit design, it is desired to maintain a fixed impedance between traces, particularly for differential pair (edge coupled) transmission lines. This lateral migration of traces during lamination causes the transmission line impedance of the finished PCB differential pair to vary over the length of the trace, which causes reflections and losses in the transmission line compared to one with fixed impedance characteristics resulting from constant spacing. Additionally, the formation of traces is a separate step from the lamination step, resulting in many steps in the fabrication of multi-layer circuit boards. Another consideration of circuit boards fabricated with copper conductors is that prior to circuit board assembly (the soldering of components onto the finished printed circuit board), the oxidizing copper traces are coated with non-oxidizing nickel or other material which is compatible with the subsequent addition of solder paste used for soldering surface mount components placed on the solder paste prior to baking the circuit board at a temperature sufficient to melt the solder paste and complete the electrical connections.

For these reasons, it is desired to provide a circuit board with well controlled impedance, and well controlled trace geometries. It is also desired to provide a multi-layer circuit board where the lamination of layers and trace formation can be performed in a single step. It is further desired to form the traces in channels to prevent migration of traces during a lamination process.

OBJECTS OF THE INVENTION

A first object of the invention is one or more layers of catalytic pre-preg formed by the mixture of catalytic particles, resin, and fiber matrix which has a distribution of catalytic particles an exclusion depth below a surface layer, where an exposed region below the exclusion depth has sufficient catalytic particle density to provide electroless copper deposition, and where trace channels are formed into the surface of the catalytic laminate below the exclusion depth, the electroless copper deposition into the channel being sufficient to allow the formation of conductive traces into the channels by filling the channels with conductive metal particles, thereafter exposing the metal particles and trace channels to a baking temperature which is greater than the melting temperature of the metal particles and sufficient to form traces from the conductive metal particles, optionally performed during a lamination step to other layers and interconnecting the layers at via or channel locations which are adjacent to each other.

A second object of the invention is a multi-layer circuit board formed from a plurality of catalytic laminates, each catalytic laminate having a resin rich surface having insufficient density of catalytic particles to support electroless copper deposition, and having catalytic particles below an exclusion depth with sufficient density to allow electroless deposition, the surface of the catalytic laminate having channels and apertures which extend below the exclusion depth, the channels having traces formed from the application of conductive metal particles which have been melted in the channels and apertures to form traces.

A third object of the invention is a method for forming a circuit board layer from a catalytic laminate formed from a resin mixed with catalytic particles and optionally a fiber mesh, the catalytic particles supporting electroless copper deposition only in channels formed below a catalytic particle exclusion depth of the catalytic laminate, the circuit board layer optionally having apertures for electrical interconnection across opposite surfaces of the circuit board layer, the channels and optionally apertures filled with conductive metal particles, the conductive metal particles and catalytic laminate heated to a temperature sufficient for the conductive metal particles to melt together to form conductors in the channels and apertures.

A fourth object of the invention is a method for forming a multi-layer circuit board from separate circuit board layers, each circuit board layer formed from a catalytic laminate comprising a resin mixed with catalytic particles and optionally a fiber mesh and cured as described in FIGS. 1A and 1B, the catalytic particles of at least one circuit board layer supporting electroless copper deposition only in channels which are formed below a catalytic particle exclusion depth of the catalytic laminate, at least one circuit board layer optionally having apertures for electrical interconnection across opposite surfaces of the circuit board layer, the channels and optionally apertures of each circuit board layer filled with conductive metal particles, at least two circuit board layers stacked together and the conductive metal particles and catalytic laminate heated to a temperature sufficient for the conductive metal particles melting together to form conductors in the channels and the at least two circuit board layers to bond to each other.

SUMMARY OF THE INVENTION

In a first embodiment of the invention, a catalytic pre-preg is formed by blending a resin, volatile solvent, and catalytic particles to form a catalytic resin mixture, infusing the catalytic resin into a fiber fabric such as woven glass fiber or other fabric to form an "A-Stage" catalytic pre-preg, baking the fiber and resin together at elevated temperature to remove most of the volatile solvent and form a partially cured "B-Stage" catalytic pre-preg such as in sheet form, thereafter placing the B-stage pre-preg into a lamination press, heating the B-stage pre-preg at a gel point such that the pre-preg is in a liquid/solid equilibrium, thereafter curing the pre-preg at an elevated temperature and pressure for a dwell time sufficient for the catalytic particles to migrate away from the outer surfaces of the pre-preg and to form a finished "C-stage" pre-preg with a resin-rich surface which is free from exposed surface catalytic particles. The mechanical removal of this resin rich surface thereby exposes the underlying catalytic particles, forming a surface suitable for electroless plating using copper ions in solution, or any suitable electroless plating metal ions in solution.

In a second embodiment of the invention, a single or multi-layer PCB is formed by patterning an exposed surface onto a catalytic pre-preg having a resin rich surface which excludes catalytic particles from the surface, where the catalytic particles are distributed an exclusion depth below the resin rich surface and are not exposed. In a first step, optional through vias (apertures) are formed through the catalytic laminate, exposing catalytic particles in the drilled surfaces and channels are formed into the surfaces of the catalytic laminate, resulting in the underlying catalytic particles being exposed. The apertures and channels may be formed by removing the surface of the catalytic material using any removal means, including laser ablation, plasma etching, chemical etching, mechanical abrasion or cutting, using any of these techniques with or without a pattern mask. In a second step, the catalytic laminate is placed in an electroless plating bath, where the metal of the electroless plating (such as Cu) is attracted to, and bonds to, the exposed catalytic particles (such as Pt) in the patterned regions where the resin rich surface has been removed. The second step is performed until the electroless plating covers the sides and bottom of the patterned trench channel and optional apertures with plated metal, but only a thickness sufficient to fill the trench channel, such as a copper electroless plating thickness in the range of 0.05-0.20 mil (~1 um to ~5 um). In a third step, a conductive paste comprising a suspension of particles of metal with a comparatively low melting temperature such as 180° C. mixed with a suitable wetting agent for a subsequent particle consolidation step is applied to fill the channels and vias, such as by using an unpatterned (blanket coverage) surface application followed by a squeegee of the surface to remove excess conductive paste from regions other than channels and apertures. The thickness of the second step electroless plating is typically the minimal amount required to maintain bonding of the conductive metal particles so the inner surfaces of the electroless copper lined channels and via apertures after a baking step.

In an example embodiment of the invention, separate catalytic laminate layers have channels and optional apertures formed to the exclusion depth, the catalytic laminate layers are electroless plated sufficient to form traces when the channels and apertures are filled with metal particles and baked at the metal particle sintering or melting temperature, but the final step involves positioning one or more catalytic layers prepared with channels filled with conductive paste together and into a lamination press such that lamination of the layers and sintering or melting of the metal particles into traces occurs in one step.

Optional additional steps provide for the fabrication of multi-layer boards. In this variation, two additional outer layers which have been prepared as previously described, with optional vias and channels formed, flash electroless copper plated, with the channels and vias filled with metal particles with a comparatively low melting temperature and placed into the lamination press. The melting temperature of the metal particles in the conductive paste is selected to be below the lamination temperature to ensure consolidation of the metal particles during lamination of the layers to each other. As the lamination temperature is greater than the melting temperature of the particles of metal in the trace channels, lamination and trace formation occur in a single step. Additional outer layers may be thereafter applied in a series of additional operations to form as many layers as needed. In one example embodiment, a layer is applied to each outer surface and laminated to the previously laminated inner core layers. In an alternative embodiment, the layers are all positioned together in the lamination press prior to any lamination step, and all layers are laminated and metal particles melted or sintered into electrically conductive traces in a single step. In an optional subsequent step, soldermask is applied to cover regions of the catalytic laminate and regions of the patterned traces.

In a third embodiment of the invention, the catalytic pre-preg of the first embodiment has via apertures formed through drilling or ablation or other means of removing material to create an aperture from one surface to the opposite surface of the catalytic pre-preg, the aperture adjacent to a pad region where the surface of the catalytic pre-preg is removed adjacent to the aperture, thereby exposing underlying catalytic particles of the catalytic pre-preg in the inner surfaces of the aperture and also the outer surfaces of the catalytic pre-preg. The channels and via through holes are subsequently exposed to a flash electroless copper plating for an interval of time sufficient to coat the inner surfaces of the channels and through holes to enable a deposition layer to form for adhesion of a subsequently applied conductive paste containing metal particles which melt onto the deposition layer surface. In one example of the invention, the copper electroplate thickness is in the range of 0.05 to 0.15 mil (~1 um to ~4 um), or alternatively, the electroplate thickness is on the order of 2 um. During a subsequent lamination step, the metal particles in the electroless plated channels melt or sinter together as well as to the deposition layer to form electrically conductive traces. The lamination step may be performed on a single layer with through holes or channels, or it may be performed on the outer layers of an inner laminated core, or it may be performed on all inner and outer layers at one time. The flash electroless deposition layer has a resistivity which is at least 10× greater than the conductive traces subsequently formed. This provides a time savings in the electroless copper deposition over alternative trace forming methods, as well as providing component mounting advantages during assembly of components onto the board.

BRIEF DESCRIPTION OF THE DRAWINGS

FIGS. 6A through 6G show processing steps according to the present invention.

DETAILED DESCRIPTION OF THE INVENTION

Figure 1A:
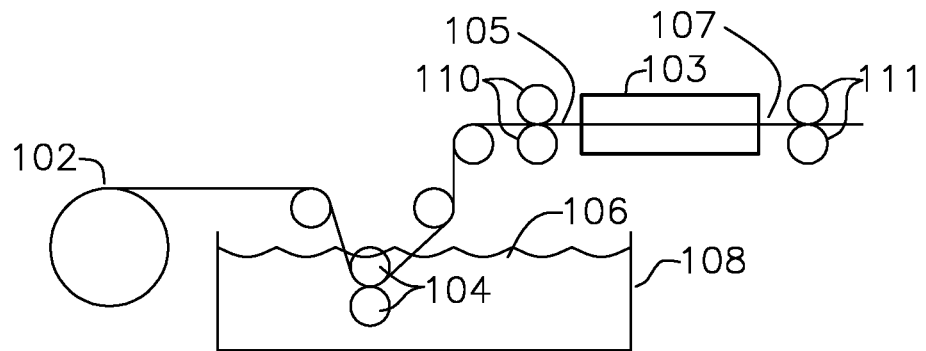
FIG. 1A shows a schematic view of a process for forming a raw catalytic pre-preg.

FIG. 1A shows an example process for fabricating pre-preg (a matrix of pre-impregnated fibers bound in resin). Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon) blend resin, or other resins. One aspect of the invention is a printed circuit board laminate capable of supporting fine pitch conductive traces having trace width and edge separation from other traces on the order of 1 mil (25 u). While the description is drawn to the formation of copper traces using catalysts for electroless copper formation, it is understood that the scope of the invention may be extended to other metals suitable for electroless plating and electro-plating. For electroless deposition of copper (Cu) channels, elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, as it is known in the art that other catalysts for attracting copper ions during electroless plating may also be used. In one example of the invention, the catalytic particles are homogeneous catalytic particles. In another example of the invention, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide (SiO2), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: BrPd, $CL_2Pd$, $Pd(CN)_2$, $I_2Pd$, $Pd(NO_3)_2*2H_2O$, $Pd(NO_3)_2$, $PdSO_4$, $Pd(NH_3)$ $4Br_2$, $Pd(NH_3)4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers).

Among the catalysts, palladium is a preferred catalyst because of comparative economy, availability, and mechanical properties, but other catalysts may be used.

FIG. 1A shows a roll of fabric cloth 102 such as woven glass fiber is fed through as set of rollers which guide the fabric into tank 108 which is filled with an epoxy resin blended with catalytic particles and mixed with a volatile liquid to reduce the viscosity, thereby forming an A-stage (liquid) pre-preg.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant ε (permittivity), which is often approximately 4 and governs the characteristic impedance of a transmission line formed on the dielectric, and loss tangent δ, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller. These are example catalytic particle size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings. In another example, the catalytic resin mixture 106 is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 8-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

Figure 1B:
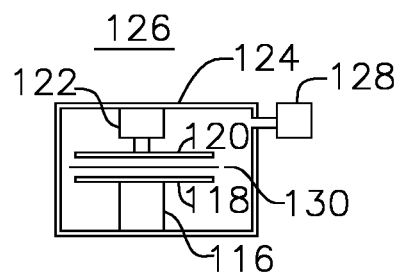
FIG. 1B shows a vacuum lamination press for forming a finished catalytic pre-preg from a raw catalytic pre-preg.

After the fabric is immersed into the catalytic resin bath 106 with rollers 104, the catalytic resin impregnated cloth is guided to rollers 110, which establish the thickness of the uncured liquid A-stage pre-preg 105 which also establishes the percentage of resin in the resin/glass+resin ratio. The A-stage pre-preg 105 is then passed through a baking oven 103 which drives out the organics and other volatile compounds of the A-stage pre-preg and greatly reduces the liquid content, forming tack-free B-stage pre-preg 107 delivered by rollers 111. In an example embodiment, oven 103 dries the volatile compounds from an about 80% solvent ratio of A-stage pre-preg to less than about 0.1% solvent ratio for B-stage pre-preg. The resulting B-stage pre-preg 107 is provided to material handling 111 and can be cut into sheets for ease of handling and storage, and is later placed into the lamination press 126 of FIG. 1B which applies pressure across the surface of the sheets under vacuum, changing the temperature profile while the pre-preg core is in the lamination press, following the temperature plot 202 shown in FIG. 2. In one example of the invention, to create the resin rich surface, the pre-preg sheets positioned near the outer surfaces (which will later have the surface removed to expose the underlying catalytic particles) are selected to have greater than 65% resin, such as Glass 106 (71% resin), Glass 1067, or Glass 1035 (65% resin), and the inner pre-preg sheets (which are not subject to surface removal) are selected to have less than 65% resin. Additionally, to reduce the likelihood of fiberglass being present near the surface of the catalytic pre-preg, a woven fiberglass may be used with the inner pre-preg layers and a flat unwoven fiberglass may be used in the outer resin rich pre-preg layers. The combination of resin-rich pre-preg and flat unwoven fiberglass on the outer surface layer results in an exclusion zone of 0.7 mil (17 u) to 0.9 mil (23 u) between an outer surface and the encapsulated fiberglass. Glass styles 106, 1035, and 1067 are preferred for use on the outer resin rich surface since the glass fiber thicknesses are smaller (1.3-1.4 mil/33-35 u) than the glass fiber thickness found in typical pre-preg sheets with greater than 65% resin used in the central regions of the laminate, such as glass style 2116, which has 3.7 mil (94 u) fibers. These values are given as examples, the smallest glass fibers which are commercially available are expected to continue to reduce in diameter. The temperature vs. time plot 202 is tailored in the present invention to cause the catalytic particles and fiberglass to migrate away from the outer surface of the laminate, repelled by the surface tension of the epoxy during a liquid state of the gel point temperature. After the cooling cycle of plot 202, the cured C-stage pre-preg sheets are offloaded 114. The process which forms the cured C-stage pre-preg sheets may use single or multiple sheets of fiber fabric to vary the finished thickness, which may vary from 2 mil (51 u) to 60 mil (1.5 mm).

Figure 3:
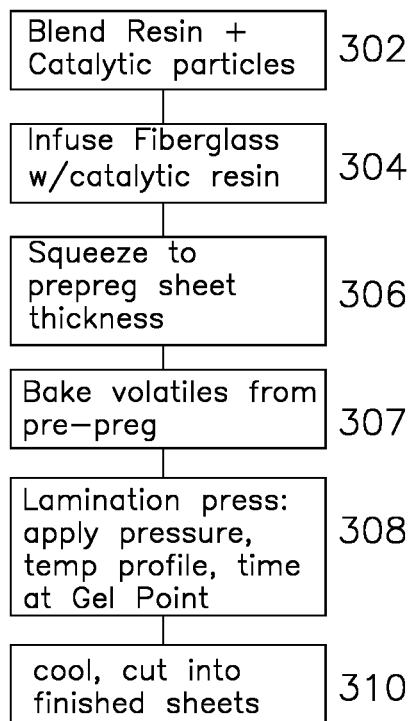
FIG. 3 shows process steps for formation of a catalytic pre-preg.

FIG. 3 shows a flowchart for the process of making pre-preg laminate with catalytic particles infused but excluded from the outer surface of the pre-preg. Step 302 is the blending of catalytic particles into the resin, often with an organic volatile added to lower the mixture viscosity, which forms the catalytic resin 106 placed in reservoir 108. Step 304 is the infusion of catalytic resin into the fabric such as rollers 104 of FIG. 1 may provide to form A-stage pre-preg, and step 306 is the initial rolling of catalytic resin infused fabric into B-stage pre-preg such as by rollers 110, step 307 is a baking step for removing organic solvents to form B-stage pre-preg, and step 308 is the pressing of catalytic resin infused fabric 130 into sheets of catalytic C-stage pre-preg in lamination press 126, which follows the temperature cycle of plot 202, with vacuum pump 128 evacuating chamber 124 throughout the lamination process to remove air bubbles from the epoxy and reduce any air voids that may form in the epoxy. The cooled finished catalytic C-stage pre-preg sheets are cut and stored for later use.

Figure 2:
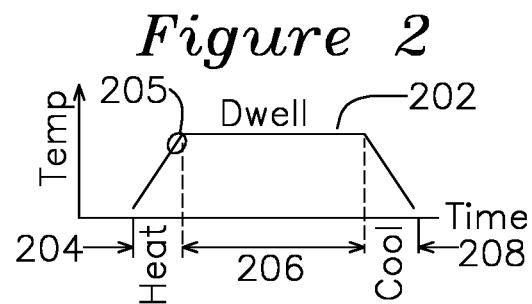
FIG. 2 shows processing times for a vacuum lamination step of FIG. 1.

The FIG. 2 plot 202 of temperature vs. time shows the temperature profile of the pre-preg in the lamination press 112, which is critical for the formation of a catalytic pre-preg which has surface property of catalytic particles being excluded from the outer resin rich surface, but which are present just below the outer resin rich surface. The resin is in liquid state in reservoir 108, and the pre-preg is in in an A-stage after the resin is impregnated into the fiberglass and passes through rollers 110. The pre-preg is in a B-stage after baking 103 where the volatile organics are baked off accompanied by an initial resin hardening, which converts the B-stage pre-preg into becomes C-stage pre-preg at the end of the lamination cycle, such as the cooling phase of FIG. 2. The B-stage pre-preg is placed into the lamination press and a vacuum is pulled to prevent trapped air from forming between lamination layers. Heat is applied during a temperature ramp-up time 204 to achieve a temperature and pressure determined pre-preg gel point 205 for a duration on the order of 10-15 seconds (the gel point defined as the state where the liquid and solid states are close to equilibrium with each other), which is critical for the process of migrating the catalytic particles away from the surface, after which the temperature of the pre-preg is maintained at the dwell temperature and dwell time 206 which may be in the range of 60-90 minutes, followed by a cooling cycle 208. The dwell temperature and gel point temperature are pressure and resin dependent, in the example range of 120° C. (for epoxy) to 350° C. (for Teflon/polyimide resins). Maintaining the pre-preg at the gel point 205 for too short of a duration will result in the catalytic particles or fiberglass being undesirably present at the surface of the finished pre-preg.

Figure 4:
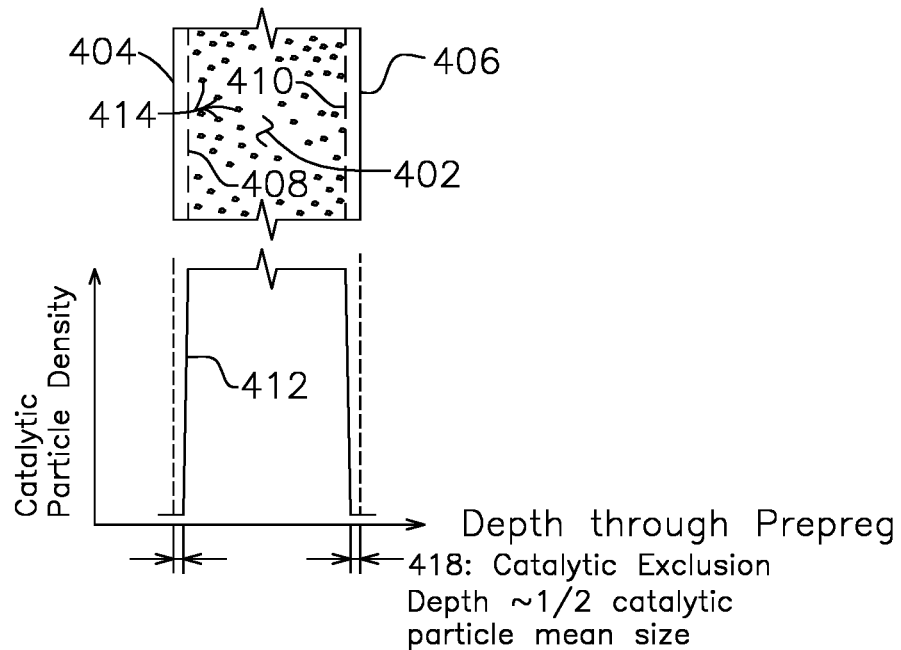
FIG. 4 shows a plot of catalytic particle distribution in a pre-preg material with respect to a section view of the pre-preg material.

FIG. 4 shows the resultant catalytic pre-preg 402 formed by the process of FIGS. 1, 2, and 3, where the catalytic particles 414 are distributed uniformly within the central region of pre-preg 402, but are not present below a boundary region 408 below first surface 404, or below boundary region 410 below second surface 406. For the example particle distribution of particles smaller than 25 u, the catalytic particle boundary is typically 10-12 u below the surface (on the order of half of the particle size), accordingly this depth or greater of surface material must be removed for the embedded catalytic particles to be available for electroless plating.

Prior art catalytic laminates have activated surfaces that must be masked to prevent unwanted electroless plating on the activated surface of the catalytic laminate. By contrast, the catalytic laminate of the present invention excludes catalytic particles over the thickness extent from first surface 404 to first boundary 408, and from second surface 406 to second boundary 410, providing the benefit that a separate mask layer preventing contact with the catalytic particles is not required for electroless plating as it is in the prior art. Accordingly, removal of surface material from either first surface 404 to the depth of boundary layer 408 or deeper, or removal of surface material from second surface 406 to second boundary 410, results in the exposure of catalytic material which may be used for electroless plating. It is also desirable for the process which provides the resin rich surface to also exclude not only catalyst, but the fiber fabric, as removal of the surface layer in subsequent steps which results in the exposure of fibers requires additional cleaning steps, accordingly it is preferred that the surface removal be of resin only, so as to expose the underlying catalytic particles. This is accomplished by using a combination of resin-rich outer pre-preg layers and flat unwoven fiberglass layers having smaller diameter fibers on the outside layers. An additional advantage of forming traces in channels using electroless plating is that the traces are mechanically supported on three sides, which provides greatly improved trace adhesion to the dielectric laminate.

Figure 5:
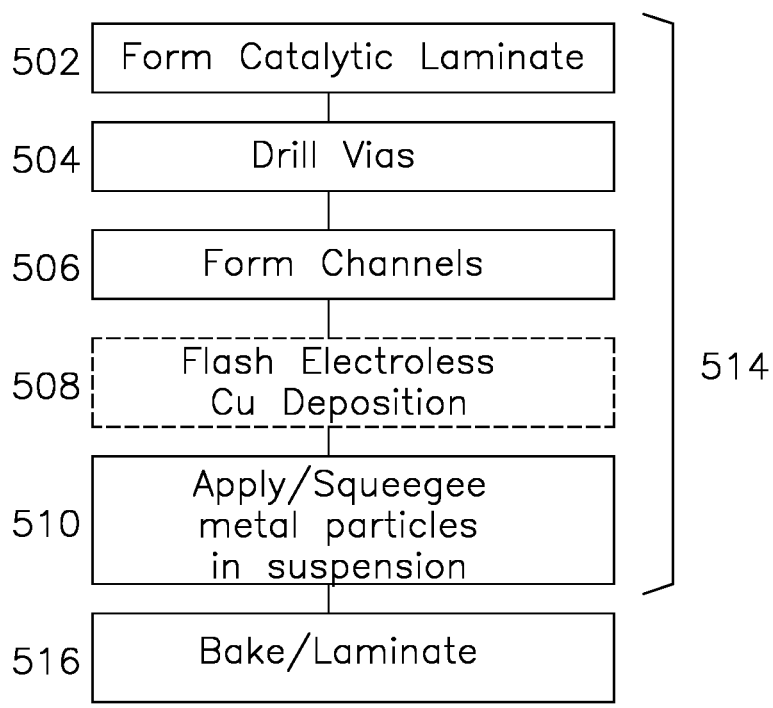
FIG. 5 shows process steps for forming a single circuit board layer according to an example of the present invention.

FIG. 5 shows a process for forming a single layer circuit board using a catalytic laminate which may be formed 502 or otherwise provided in the form with catalytic particle distribution as shown in FIG. 4 with exclusion depth 418 which provides electroless deposition in channels deeper than the exclusion depth 418, and does not support electroless plating on the surface or areas which do not have surface material removed, which is a fundamental characteristic of the catalytic laminate formed by the process of FIGS. 1A, 2, and 3 and presented in step 502 of FIG. 5. The catalytic laminate 502 may have optional apertures (vias) formed in step 504, after which channels are formed which extend below the exclusion depth in step 506. The vias and channels may be formed using any method, including laser drilling, mechanical drilling, chemical etching, plasma etching using a mask or by direct application to a localized region. In a preferred method, the channels and vias are formed using a laser ablation, with the laser scanned along the pattern of the channels and vias and amplitude modulated for rectangular channel shape. Alternatively, other channel shapes (trapezoidal, negative edge slope, positive edge slope) may be formed, although rectangular channels are preferable.

The board is placed into an electroless copper bath in step 508, which results in the electroless deposition of copper in the channels and optional apertures. This electroless deposition is performed to provide the thinnest layer of metal such as copper to ensure the metal particles melt into traces in the channels and apertures, preferably in the range of 1-4 um, or alternatively on the order of 2 um.

Step 508 is shown in dashed line, as in an alternative embodiment of the invention with respect to FIG. 5, step 502 uses a non-catalytic laminate and no electroless copper deposition is performed in step 508. Vias apertures are drilled 504 and channels formed 506, after which step 510 is performed, and the metal powder is provided into the channels and apertures without any previously deposited metal present in the channels or apertures previously formed. In this alternative embodiment without electroless copper deposition, any of the conductive metal powders may be used in combination with a baking/sintering process, however leaded or lead-free solder paste formulations of the conductive paste are typically not used, as they require a copper substrate for successful surface wetting and conductive paste bonding. Lead-free conductive pastes in commercial use may contain tin, copper, silver, bismuth, indium, zinc, antimony, and traces of other metals. Conventional leaded conductive paste formulations are 60/40 and 63/37 Sn—Pb, which provide eutectic properties.

For use with either the catalytic or non-catalytic layer with channels and apertures, the metal particles are introduced into the channels and apertures in step 510. In one example of the invention, the metal particles are provided as a suspension of metal with a wetting agent and applied using a squeegee which ensures the metal particles are present only in the channels and optional apertures, and not distributed over the surface of the circuit board. The squeegee metal particle infusion may be performed on one side at a time, or both sides together, or to a single side for a single-sided board with channels on one side only, or on both sides for a two-sided board. For a single board, bake step 516 is performed at a temperature sufficient to cause the metal particles in the channels and any apertures to sinter together to form an unconsolidated porous trace, or preferably to melt together and form a homogeneous trace without gaps or voids.

The conductive paste may be any conductive paste known in the prior art, such as an emulsion of electrically conductive particles with an average size on the order of 10 u, where the conductive particles include at least one of copper, silver, gold, palladium, nickel, indium, bismuth, tin, or lead, optionally combined in ratios to form a eutectic system with a preferentially low single melting temperature, or the particles may be formed from copper coated with gold, silver, or nickel, the particles of either type mixed with a binder such as phenolic plastic, novolac epoxy resin (a pre-polymerized resin which cures upon application of heat), or other resin mixed with a solvent such as any of: diethylene glycoldibutyl ether, poly(formaldehyde/phenol) 2,3 epoxy propyl ether, or ethyl sorbitol acetate, each of which provides a quick drying time. Alternatively, the conductive particles may be mixed with a binder such as aliphatic acid or stearic acid and a solvent such as alcohol or acetone. An example commercially available conductive powder is GB05K (5.5 um average particle size) or GB10K (10 u average particle size) silver-plated copper powder manufactured by Hitachi Chemical Co., with aspect ratio of approximately 1.0. Although these are commercially available examples, it is preferred that the paste contain conductive metal particles on the order of 1 um or smaller, although this requirement scales with the width and depth of the related channel. In a preferred embodiment, the metal particles have a maximum length which is on the order of 1/100th of the width of the channel or aperture feature or less, alternatively the particle size may be on the order of 1/4 of the channel depth or less. Particle sizes significantly smaller than 1/4 of the channel depth are preferable for better filling of the channels, such as on the order of 5um.

In one example of the invention, the conductive paste is commercially available MP500 manufactured by Tutsuta Corporation (www.tatsuta.com), having example properties of a maximum metal particle size of 25 um and having half of the metal particles in any given volume in the size range of 4-6 um. In another example of the invention, the conductive paste has a composition by volume or by weight of any of Sn (40-50%), Cu (20-30%), Ag (1-10%), Ni (1-10%), Zn (1-10%), Bi (10-20%), and resin (4-7%). In another example of the invention the conductive paste is commercially available Ormet 701 manufactured by Ormet Circuits (www.ormetcircuits.com).

Figure 1C:
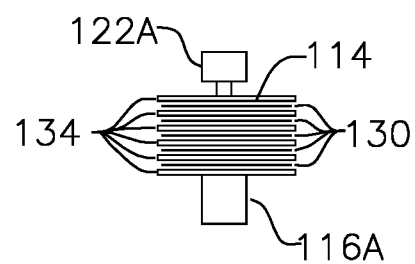
FIG. 1C shows a vacuum lamination stage to for forming multiple layers of catalytic pre-preg during a lamination.

In a preferred embodiment of the invention, the steps of 514 may be performed separately to form several individual boards, and the boards may be aligned and stacked into a lamination press such as 134 of FIG. 1C, and then heated and pressed together until the individual boards are laminated together and the traces form from the consolidation and melting of metal particles in the channels and apertures, including any interconnections from one circuit board to another across the laminated surfaces and across vias. In this manner, it is possible to form a laminated circuit board and form the conductive paste into conductive traces in a single process step.

FIGS. 6A through 6G show section views of a circuit board formed using the steps of the process. FIG. 6A shows a catalytic laminate with outer surfaces 602A and 602B which are free of catalytic particles, but have catalytic particles an exclusion depth below the surface. FIG. 6B shows optional laser drilled holes 604 and 606, which expose the catalytic particles in the inner surfaces of the drilled apertures or vias 604 and 606. FIG. 6C shows the formation of channels 608A on the top surface and 608B on the bottom surface. An optional annular ring channel may be formed around each of the via apertures 604. FIG. 6D shows the electroless copper flash step where the channels and via apertures receive a thin electroless copper film, which supports the adhesion of traces formed later into the channel. FIG. 6E shows the application of metal particles such as a paste emulsion of a wetting agent and metal particles such as copper, silver, gold, palladium, nickel, indium, bismuth, tin, or lead, optionally combined in ratios to form a eutectic system with a preferentially low single melting temperature, or using particles may be formed from copper coated with any of gold, silver, or nickel. The metal particles are preferably smaller than 1/3 of the smallest dimension of the channel, for example a 0.001 inch (~25 um) channel with a depth of 3 u would utilize metal particles on the order of 1 um or smaller. FIG. 6E electroless plated circuit layer with paste may be heated until the metal particles and optional wetting agent form circuit board traces, the circuit layer of FIG. 6E may be applied to one or more other layers for lamination and melting of the metal particles into traces in a single step. FIG. 6F shows an example where layer 622 was previously baked until the metal particles sintered or melted into conductive traces, and layers 624 and 620 with metal particles are aligned and positioned next to each other, then heated and pressed together to form a laminated multi-layer circuit board. Additional layers with metal particles in channels may be subsequently applied to the outer layers of the laminated assembly of a previous step to form the multi-layer circuit board. The lamination and melting of metal particles into traces may be performed using all of the layers of the circuit board in a single elevated temperature lamination step, or it may be performed on successions of outer layers until all layers are laminated and traces formed form melted metal particles. FIG. 6G shows a final multi-layer board with vias 626 and 630 providing connectivity from one trace layer to another and layers 624 and 620 laminated to layer 622, the lamination and trace formation through conductive paste melting performed in a single step or as sequential operations.

Figure 7A:
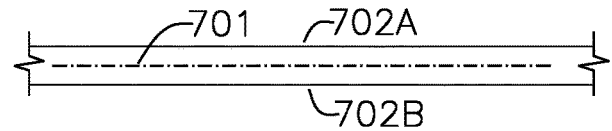
FIG. 7A through 7F shows processing steps of an outer layer according to the present invention.
Figure 7B:
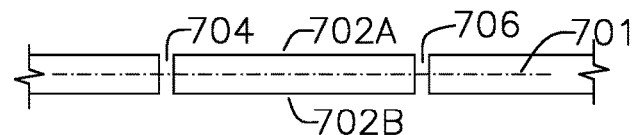
Figure 7C:
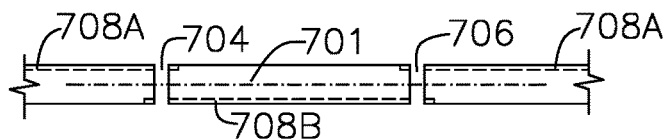
Figure 7D:
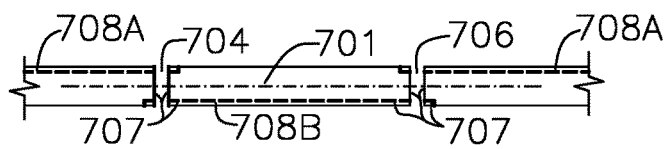
Figure 7E:
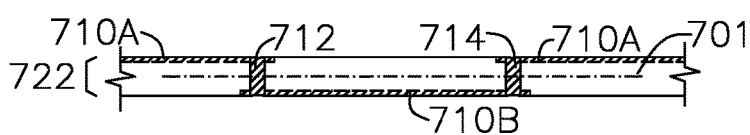

FIG. 7A shows an example outer layer process according to another embodiment of the invention. Outer layers 702A and 702B are laser drilled 704 and 706, as before, channels 708A and 708B are formed, and electroless plated as shown in FIG. 7D. The layers are laminated to inner layers such as those formed using the process of FIGS. 5 and 6A to 6G shown compressed and out of scale as dashed line 701. The laminated board is subjected to a solder dip 7E where the board is immersed in solder, and a hot air knife providing a continuous line of heated air is drawn across the board (such as by transporting the board through the air knife), which drives the excess solder away from the surface and into the channels and via apertures, forming traces in the lands using solder rather than metal particles. This is advantageous since electronic components are mounted on the outer layers, and since the traces are formed from solder, no additional processing steps (paste mask and solder paste) are needed after the final processing step of FIG. 7F.

Figure 7F:
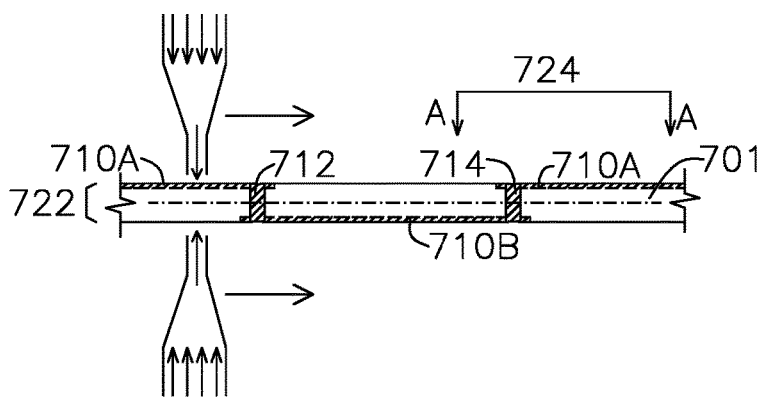
Figure 7G:
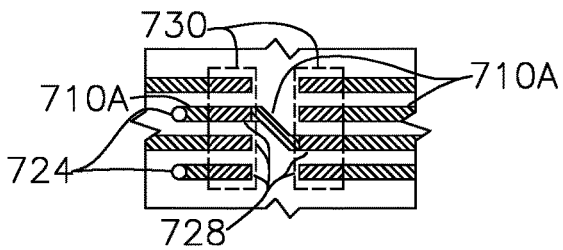
FIG. 7G shows a top view of an outer layer processed according to the steps of FIGS. 7A through 7F.

FIG. 7G shows a top view 724 of FIG. 7F, with traces 710A, via 724, the traces transitioning to lands 728 formed from solder and ready for application of an example 8 pin surface mount integrated circuit. Since the lands (and traces) are formed from solder which is compatible with mounting components onto the board using prior art techniques, the subsequent assembly step of putting components on the circuit board is simplified. In the prior art, a separate paste mask tool is applied with apertures corresponding to component lands, and a solder/wetting agent paste is applied. In the present construction, only a wetting agent need be applied, the components placed on top of the lands, and solder reflow in an elevated temperature oven performed, thereby saving steps and tooling compared to prior art processes.

In another variation of the invention, for the outer layers of the board, an additional step 7G may be added whereby a soldermask is applied to all regions other than region 730 surrounding lands 728, as is done in the prior art using a soldermask tool for preventing the application of soldermask to the component lands. In one tooling-free example of the invention, a soldermask is applied to the entire surface of the outer circuit layer, and removed in the regions 730 of the component lands 728 by laser ablation, revealing the underlying component lands 728.

In an example embodiment of the invention for use with through hole components (components with leads which are positioned into conductive holes of the laminated board assembly), a secondary operation of drilling component mounting holes is performed in the vias after the lamination/melting step in the aperture locations where through hole components are to be mounted. The drilled holes are smaller diameter than the filled via apertures to create an annular ring of conductive material surrounding the drilled component mounting hole.

The preceding description is only to provide examples of the invention for understanding the underlying mechanisms and structures used, and is not intended to limit the scope of the invention to only the particular methods or structures shown. For example, the sequence of figures and 6 may be used with a single sided or two sided construction. The via apertures of FIGS. 6F and 6G may be offset across layers, or aligned to provide a continuous plugged aperture for drilling to form a through hole component mounting annular ring, as was previously described, and the processing shown in layers 7A to 7F may be used to form outer layers of two sided (single laminate layer) boards, or multi-layer boards without loss of generality.

In the present specification, "approximately" is understood to mean less than a factor of 4 greater or smaller, "substantially" is understood to mean less than a factor of 2 greater or smaller. "Order of magnitude" or "on the order of" a value includes the range from 0.1 times the value to 10 times the value.

Certain post-processing operations are not shown which are generic to printed circuit board manufacturing, and may be performed using prior art methods on boards produced according to the novel process. Such operations include tin plating for improved solder flow, gold flash for improved conductivity and reduced corrosion, soldermask operations, silkscreening information on the board (part number, reference designators, etc.), scoring the finished board or providing breakaway tabs, etc. Certain of these operations may produce improved results when performed on planarized boards of certain aspect of the present invention. For example, silkscreened lettering over traces or vias traditionally breaks up because of trace and via thickness over the board surface, whereas these operations would provide superior results on a planarized surface.

We claim:

1. A circuit board layer comprising:
   a catalytic pre-preg layer comprising an epoxy resin having a distribution of catalytic particles an exclusion depth below a surface layer which are sufficient to provide electroless copper deposition when the catalytic particles are exposed;
   the catalytic pre-preg layer having trace channels with a depth below the exclusion depth;
   the trace channels comprising flash electroless plating in the regions where catalytic particles are exposed, the flash electroless plating sufficient to coat an inner surface of at least one trace channel with a deposition thickness of flash electroless plating in the channel which is below the surface layer;
   the trace channels further comprising conductive traces having an extent from the flash electroless plating in the channel to the surface layer, the conductive traces formed from melting a conductive paste in the channels, the conductive paste having a different composition than the flash electroless plating.

2. The circuit board layer of claim 1 where said catalytic particles are homogeneous.

3. The circuit board layer of claim 2 where said homogeneous catalytic particles are at least one of: elemental palladium (Pd) transition metal elements group 9 to 11, platinum (Pt), rhodium (Rh), iridium (Ir), nickel (Ni), gold (Au), silver (Ag), cobalt (Co), or copper (Cu).

4. The circuit board layer of claim 1 where said catalytic particles comprise a filler particle coated with a catalyst.

5. The circuit board layer of claim 4 where said filler is at least one of: a clay mineral, a hydrous aluminum phyllosilicate, silicon dioxide, kaolinite, polysilicate, a member of the kaolin or china clay family, or a high temperature plastic.

6. The circuit board layer of claim 1 where said catalytic particle is silicon dioxide or kaolin coated with a catalytic material.

7. The circuit board layer of claim 1 where said flash electroless plating is copper.

8. The circuit board layer of claim 7 where said flash electroless plating has a thickness in the range 0.2 um to 20 um.

9. The circuit board layer of claim 1 where said conductive paste contains metal particles of at least one of copper, silver, gold, palladium, nickel, indium, bismuth, tin, lead, or copper coated with gold, silver, or nickel.

10. The circuit board layer of claim 1 where said conductive paste has a composition by weight or volume of at least one of Sn (40-50%), Cu (20-30%), Ag (1-10%), Ni (1-10%), Zn (1-10%), Bi (10-20%).

11. The circuit board layer of claim 10 where said conductive paste contains a resin in the range 4% to 7% by weight or by volume.

12. The circuit board layer of claim 1 where said trace channels are formed on either one side only or on both sides of said catalytic laminate.

13. A circuit board layer formed from a catalytic pre-preg layer comprising epoxy resin mixed with catalytic particles, the pre-preg layer having a distribution of catalytic particles an exclusion depth below a surface layer which are sufficient to provide flash electroless copper deposition below the exclusion depth;
- the circuit board layer having trace channels with a depth below the exclusion depth, the circuit board layer also having apertures extending through the circuit board layer;
- the trace channels and apertures having flash electroless plating on a surface of the trace channels and on the surface of the apertures where catalytic particles are exposed, the flash electroless plating sufficient to coat an inner surface of at least one trace channel and at least one aperture;
- the flash electroless plating in the channel having an extent which is below the surface layer;
- the trace channels and apertures additionally having conductive traces formed from a different composition of metal than the flash electroless plating, the conductive traces formed by melting a conductive metallic paste in the channels and also in said apertures.

14. The circuit board layer of claim 13 where said catalytic particles are homogeneous.

15. The circuit board layer of claim 14 where said homogeneous catalytic particles are at least one of: elemental palladium (Pd) transition metal elements group 9 to 11, platinum (Pt), rhodium (Rh), iridium (Ir), nickel (Ni), gold (Au), silver (Ag), cobalt (Co), or copper (Cu).

16. The circuit board layer of claim 13 where said catalytic particles comprise a filler particle coated with a catalyst.

17. The circuit board layer of claim 16 where said filler is at least one of: a clay mineral, a hydrous aluminum phyllosilicate, silicon dioxide, kaolinite, polysilicate, a member of the kaolin or china clay family, or a high temperature plastic.

18. The circuit board layer of claim 13 where said catalytic particle is silicon dioxide or kaolin coated with a catalytic material.

19. The circuit board layer of claim 13 where said flash electroless plating is copper.

20. The circuit board layer of claim 19 where said flash electroless plating has a thickness in the range 0.2 um to 20 um.

21. The circuit board layer of claim 13 where said conductive paste contains metal particles of at least one of copper, silver, gold, palladium, nickel, indium, bismuth, tin, lead, or copper coated with gold, silver, or nickel.

22. The circuit board layer of claim 13 where said conductive paste has a composition by weight or volume of at least one of Sn (40-50%), Cu (20-30%), Ag (1-10%), Ni (1-10%), Zn (1-10%), Bi (10-20%).

23. The circuit board layer of claim 22 where said conductive paste contains a resin in the range 4% to 7% by weight or by volume.

24. The circuit board layer of claim 13 where said trace channels are formed on either one side only or on both sides of said catalytic laminate.

\* \* \* \* \*